Feb. 17, 1959 H. J. TYZZER 2,874,294

TUNING DEVICE

Filed Dec. 24, 1953 2 Sheets-Sheet 1

INVENTOR.
Howard J. Tyzzer

BY Darby + Darby

HIS ATTORNEYS.

Feb. 17, 1959 H. J. TYZZER 2,874,294
TUNING DEVICE
Filed Dec. 24, 1953 2 Sheets-Sheet 2

INVENTOR.
Howard J. Tyzzer
BY Darby & Darby
HIS ATTORNEYS.

2,874,294
Patented Feb. 17, 1959

2,874,294

TUNING DEVICE

Howard J. Tyzzer, Mountain Lakes, N. J., assignor to Ferris Instrument Company, Boonton, N. J., a corporation of New Jersey Application December 24, 1953, Serial No. 400,220

2 Claims. (Cl. 250—40)

The present invention relates to electrical tuning devices and particularly to such devices useful for tuning circuits to frequencies in the range between 100 and 1000 megacycles.

At the present time circuits tuned to resonance at frequencies of up to 100 megacycles ordinarily utilize lumped inductors and capacitors while circuits in the range above 1000 megacycles ordinarily employ tuned transmission lines or cavities having distributed inductance and capacitance. Difficulty has been experienced in providing simple and accurately reproducible tuned circuits of frequencies between these values, where the size of lumped inductors and capacitors become very small, so as to offer production difficulties, whereas the size of distributed constant circuits become so large as to be unwieldy and space-consuming.

The present invention, as stated, is intended for the tuning of circuits to frequencies in the range of from 100 to 1000 megacycles and has inductance and capacitance built into its structure so that no separate component parts need be utilized. Further, the device is so arranged as to simultaneously vary the inductance and capacitance as an element thereof is rotated. Such simultaneous variation of inductance and capacitance provides a greater range than is normally obtained by a variation of one only of the circuit constants and additionally results in a variation of frequency with rotation which is a more nearly linear relationship than can be obtained by the variation of one only of the factors.

Such simultaneous variation of inductance and capacitance by the use of a unitary structure has been achieved, but known devices have the major disadvantages of high manufacturing cost, spurious response points, and difficulty in coupling to the device with which it is used.

The present invention provides a new type of tuner primarily for tuning the range of frequencies from 100 to 1000 megacycles which tuner provides for simultaneous inductance and capacitance variation and has a marked freedom from spurious response points. Additionally the device is extremely simple and inexpensive and is readily coupled to the cooperating device such for example as wave meters, receiver tuners and oscillators.

The tuner of the present invention resembles in physical structure an ordinary door hinge and has for this reason been termed a hinge-type tuner.

It is an object of the present invention to provide a tuning device having inductance and capacitance built into the structure.

It is another object of the invention to provide such a tuner so organized as to simultaneously vary both inductance and capacitance.

It is another object of the invention to provide such a tuner operable in the range of from 100 to 1000 megacycles and having substantially no spurious responses at any point in the range.

It is a further object of the invention to provide such a device the movable element of which operates through a 180° angle as respects the stationary element and in which the elements are shaped to produce a desired change in frequency as a function of angular rotation of the moving element.

It is a still further object of the invention to provide such a tuning device which may be readily coupled to cooperating devices such as receivers, oscillators and wave meters.

Other objects and features of the invention will be apparent when the following description is considered in connection with the annexed drawings, in which, Figure 1 is a side elevation of an oscillator incorporating a hinge type tuner in accordance with my invention;

Figures 1, 2, 3, 4:
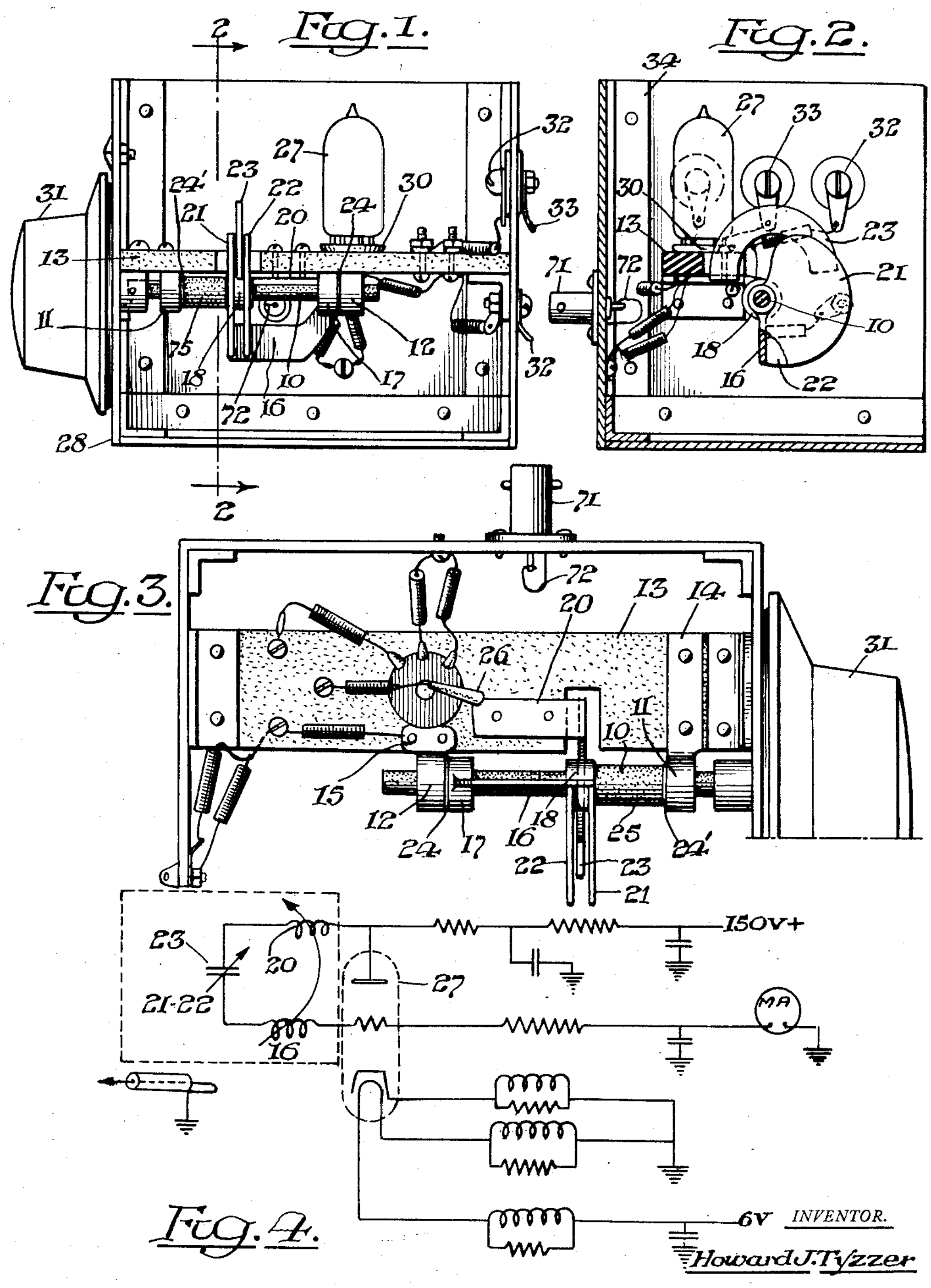
Figure 2 is a vertical cross-sectional view of the oscillator of Figure 1, the view being taken on the plane of the line 2—2, of Figure 1.
Figure 3 is a bottom plan view of the oscillator of Figure 1.
Figure 4 is a schematic circuit diagram of the oscillator of Figures 1 through 3.

Referring now to the drawings and particularly to Figures 1 through 3, there is shown a hinge type tuner together with other components forming an ultra high frequency oscillator designed to operate over the entire range of from 450 to 900 megacycles.

The tuner proper comprises an insulating shaft 10 which may, for example, be made of ceramic, steatite, or Micalex. The shaft 10 is rotatably mounted in metallic bearings 11 and 12 which bearings are fastened to the lower surface of a horizontally extending insulating supporting strip 13 by means of the conductive portions 14 and 15 integral respectively with the bearings 11 and 12. An inductance in the form of a metal plate 16 in the shape of a partial loop or arc as shown is fixed at one end to a collar 17 which in turn is fixed to the shaft 10 for rotation therewith. A similar inductance consisting of the suitably shaped stationary plate 20 is fixed to the insulating support 13.

Integral with or rigidly fastened to the movable plate or loop 16 and extending at right angles therefrom are two condenser plates 21 and 22, both plates being conductively connected to the loop 16 and spaced apart in an axial direction. Plates 21, 22 are fixed to a hub or collar 18 which is fixed to shaft 10 for rotation therewith. Lying between the movable plates 21 and 22 is a stationary condenser plate 23 formed integrally with or electrically connected to the stationary inductance loop 20 and extending at right angles therefrom and transversely to the axis of the shaft 10.

Between the stationary shaft bearing 12 and the collar 17 a metallic spring washer 24 is placed. A similar spring washer 24' is placed between the bearing 11 and an enlarged portion 25 of the shaft 10. Washer 24' serves purely as a thrust washer to hold the shaft to the left as seen in Figure 3 while the former washer 24 serves as a sliding contact to electrically connect the bearing 12 to the rotatable inductance loop or plate 16.

At the left hand end of the stationary inductance loop or plate 20 as seen in Figure 3 a projecting lug is formed as shown at 26 which forms a terminal to which circuit connections may be made. A second terminal is formed by conductive portion 15.

The elements thus far described constitute a series resonant circuit, with capacitance provided by plates 21, 22 and 23, and inductance provided by loops 16 and 20. The circuit may be traced from terminal 26, through inductance loop 20, capacitance 21, 22, 23, inductance loop 16, collar 17, bearing 12 to terminal 15. Since current flow through inductance loops 20, 16 is in opposite directions, their fields are opposed and their resultant inductance depends upon their mutual coupling which may be varied by moving them closer together or farther apart, by rotating shaft 10 as by a knob 31.

When knob 31 and shaft 10 are in their extreme clockwise position (as viewed in Figure 2), capacitor plate 23 has its minimum insertion between fixed plates 21, 22, being substantially clear of these fixed plates, to produce minimum capacitance. Similarly, inductance loops 16, 20 are closed, being substantially parallel to one another, to provide maximum bucking action and minimum inductance. Since resonant frequency is inversely proportional to the product of inductance and capacitance it is then a maximum.

As knob 31 is moved counterclockwise, both capacitance and inductance increase to decrease the resonant frequency, until at the extreme counterclockwise position, maximum capacitance and inductance provide minimum frequency.

The shapes of capacitor plates 21, 22, 23 can be chosen in relation to the rotation of shaft 10 so as to produce any desired relationship between resonant frequency and shaft position. Preferably, a linear relationship is provided. The inductor plates 20 and 16 are chosen to have a relatively large surface area, which, because of the skin effect by which high frequency currents flow on the surface of conductors, provides a low minimum inductance so as to extend the upper limit of the frequency range. Further, capacitor plates or enlarged plates may be used to increase the maximum capacitance, to lower the minimum frequency. In this way the single tuning device is adapted for a wide range of frequencies, and, for example, can cover the entire television U. H. F. band of approximately 450 to 900 megacycles with a single knob and without band switching.

Figure 4 shows an oscillator circuit utilizing the resonant circuit of Figures 1 to 3. As shown, the resonant circuit is a series connection of inductance 16, capacitance 21—22, 23 and inductance 20, with a variable coupling between the two inductances providing a variable total inductance. The capacitance is also variable, effectively in ganged relation with the inductance. Connected across the terminals 26 and 15 of the resonant circuit is the plate grid circuit of an electron tube 27 which, in a particular instance, is of the 6AF4 type. The plate is connected to the positive terminal of 150 volt source through a conventional plate resistor as indicated in the diagram, and the grid is connected through a resistor and bypassed grid current meter to ground. Also, the cathode is grounded through a radio frequency choke coil having a shunting resistor connected thereacross, and the filament is supplied from a 6 volt source, the filament leads likewise including radio frequency choke coils and shunting resistors.

All of the above circuit components are indicated in Figures 1 through 3 but are not given specific reference characters since the connections are obvious and since the particular circuit of the oscillator forms no part of my invention. The parts mentioned are mounted within a housing designated 28, the tube 27 being connected in the circuit by means of a socket 30 mounted on the insulating strip 13. A tuning control or knob 31 is fixed to the shaft 10 so that tuning may be effected while the housing 28 is closed, and connections for the plate and filament batteries as well as for ground are brought out to the rear of the housing so that the entire unit may be placed in service by merely connecting proper external leads to the terminals indicated on the drawing as 32, 33 and 34.

Fixed in the housing wall is a coaxial line coupling 71 terminating in a coupling loop 72 as shown particularly in Figure 3, this coupling being loop 72 located adjacent the stationary inductance loop 20 and being designed to effect transfer of energy to and from the circuit described. The spacing between loop 72 and inductor loop 20 is selected to give the desired degree of coupling between the oscillator and the external circuit connected to coupling 71.

Figure 5:
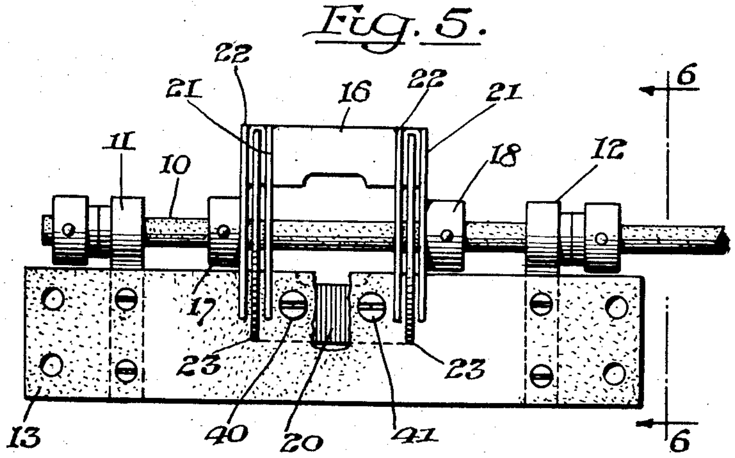
Figure 5 is a top plan view of a modification of the hinge type tuning device.
Figures 6, 7, 8:
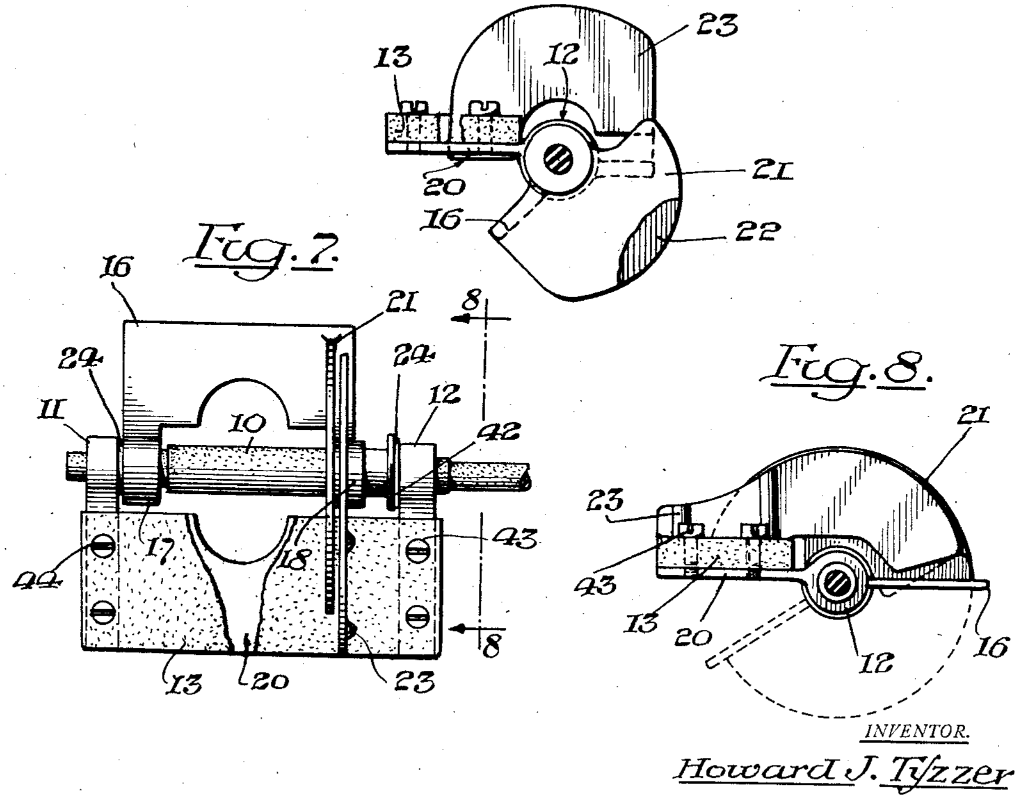
Figure 6 is a vertical cross-section of the device of Figure 5, the section being taken on the plane of the line 6—6 of Figure 5.
Figure 7 is a top plan view of a second modification of the invention.
Figure 8 is a vertical cross-sectional view of the device of Figure 7, the view being taken on the plane of the line 8—8 of Figure 7.

A modified form of the tuning device of my invention is shown in Figures 5 and 6. As before, the tuning structure is mounted on a stationary insulating plate 13, being supported in bearings 11 and 12 fixed to the plate 13. In this instance, however, no direct electrical connection is made to the moving element 16 of the inductance. On the contrary, the plate 16 has integrally formed therewith at both ends thereof capacitor plates 21 and 22 and similarly the stationary inductance plate 20 has integrally formed therewith at either end thereof a capacitor plate 23. In this instance the circuit terminals are the screws 40 and 41 which are respectively adjacent the left and right hand ends of the stationary plate 20. The circuit thus extends from terminal 40 through the capacitance formed by the left hand stationary plate 23 and left hand movable plates 21 and 22, thence through the inductance 16, through the right hand movable capacitor plates 21 and 22, right hand stationary capacitor plate 23, and to terminal 41. The inductance of stationary plate 20 is shunted across the terminals 40 and 41 and is thus in parallel with the series circuit composed of the two capacitors and the inductance 16. The terminals 40, 41 may also be placed on extensions of inductor 20 extending to the left and right of the capacitor plates 23, if desired.

If desirable the plate 20 can be formed in two sections with the dividing line occurring adjacent one end thereof in which event both inductances and both capacitors will be in a series resonant circuit.

The modified device of Figures 5 and 6 has the advantage that no sliding electrical contacts are employed, thus minimizing contact resistances and increasing the efficiency of the device. It will of course be understood that the shaft 10 is located so that the movable plate 16 rotates about a center which makes it substantially coincident with or parallel to the plate 20 when the shaft 10 is in a position yielding the minimum of inductance.

As before, the current flow in the inductive fields produced in the inductance plates 16 and 20 are opposing. The movable portion of the structure (namely, 21, 22, 16) is suitably fixed to the shaft 10 for rotation therewith as for example by means of the collars 17 and 18 which are suitably pinned or otherwise fixed to the shaft 10.

Another modified form of the invention is illustrated in Figures 7 and 8. Here again an insulating shaft 10 is supported in suitable bearings 11 and 12 fixed to an insulating supporting strip 13. Mounted on the strip 13 is a stationary inductance 20 having a stationary condenser plate 23 rigidly fixed thereto and extending in a plane at right angles to the plane of the plate 20. There is also provided a movable inductance plate 16 which is fixed to the shaft 10 for rotation therewith and which has rigidly affixed thereto a condenser plate 21 lying in a plane parallel to the plane of the plate 23 and movable to increase and decrease the capacity.

In this instance a thrust washer 24 which is a spring washer of highly conductive material is placed between the bearing 11 and the bearing portion 17 formed integrally with the movable plate 16 and in like manner a thrust washer 24 is placed between the bearing 12 and the portion 18 of the movable plate 16, there being a metallic sleeve interconnecting the portion 18 with a collar 42 placed adjacent the bearing 12.

In this device screws 43 and 44 form the terminals and the circuit thus extends from terminal 43 through bearing 12, thrust washer 24, collar 42 and its cooperating sleeve, portion 18 of plate 16, inductance 16, portion 17 of plate 16, left hand thrust washer 24, bearing 11 to terminal 44. In parallel with the circuit just mentioned there is established a circuit from terminal 43 through bearing 12, thrust washer 24, collar 42, portion 18 of plate 16, and through the capacity composed of the movable and stationary plates 21 and 23 and thence through inductance 20 to terminal 44.

As in the prior cases when the movable plate 16 is in the position shown, the device will have a maximum of inductance and capacitance and the resonant frequency will be at a minimum. Rotation of the shaft 10 to a position where the plate 16 lies closely adjacent the plate 20 will decrease both the inductance and the capacitance and will therefore result in raising the resonant frequency to the highest value in the range in which the device is intended to operate.

It will be understood of course that in all modifications means are provided to prevent the plate 16 from coming into contact with the plate 20 and furthermore that both the inductance plates 16 and 20 and the capacitor plates 21—22 and 23 may be shaped to provide the values and variation of values desired.

Since in a structure of the type shown the range is determined by the ratio of minimum capacitance and inductance to the maximum values of capacitance and inductance, it may be desirable to increase the number of the stator plates 21 and 22 and of the corresponding rotor plates 23 to provide increased capacity when the plates are meshed and it may likewise be desirable to reshape the inductance plates 16 and 20 to provide a greater change in inductance.

In any of the modifications disclosed the stationary plate 20 forms a ready means for coupling the tuner to an external device. In some instances a loop or hairpin link as disclosed in connection with Figures 1 through 3 may be mounted adjacent to the plate 20 to provide for transfer of energy to and from the hinged tuner. In other instances it may be desirable to utilize capacity coupling between the tuner and the external device.

It will be understood that the tunable resonant circuits, or tuners, described above, are useful not only in the circuit of Figure 4, but also generally wherever variable or fixed tuned circuits are desired, including, but not in any way limited to, wavemeters, receivers, and oscillators.

It will further be understood that although the conductor elements have been described as plates they may be wires or bars and may be varied in shape and that when the term plate is used in the claims it includes such other forms.

As has been indicated hereinabove many modifications of the tuner other than those specifically shown may be devised, without departing from the spirit of this invention. I wish therefore to be limited not by the foregoing description which was given solely for the purpose of illustration, but on the contrary to be limited only by the claims granted to me.

What is claimed is:

1. A tuning device for radio frequency circuits comprising, in combination, a first plate inductor element forming a portion of a closed loop, and having a diametral axis, a second plate inductor element also forming a portion of a closed loop and having a diametral axis, a shaft mounting one of said plates in hinge-like manner for oscillation relative to the other with said diametral axes substantially coincident, said plates being in electrical circuit with one another and having opposed current flow providing bucking magnetic fields whereby the net inductance of the inductor elements is a minimum when they are most nearly juxtaposed and a maximum when they are most widely separated, a capacitor, the capacitance of which is varied simultaneously and in the same sense as the said inductance, said capacitor comprising a capacitor plate formed as an integral extension of said first plate at one end thereof and extending at right angles thereto and a second capacitor plate formed as an integral extension of said second plate adjacent the corresponding end thereof and extending at right angles thereto, the capacitor plates lying adjacent each other, an electrical connection from said first to said second inductor plates at the ends of said plates remote from said capacitor plate extensions, a terminal connected to said rotatable inductor plate adjacent the capacitor plate extension thereof and a second terminal connected to said rotatable inductor plate at the opposite end thereof and to the corresponding end of said fixed inductor plate, said terminals forming a connection wherein said inductor plates are in series arrangement with said capacitor across said inductance, said electrical connection between said plates comprising a collar fixed to one of said elements and rotatably supporting said shaft, a collar fixed to the second of said elements and to said shaft and a spring washer between said collars forming a sliding electrical contact.

2. A tuning device for radio frequency circuits comprising, in combination, an electrically insulating support, a generally U-shaped inductance plate mounted on said support, an insulating shaft, means rotatably supporting said shaft on said insulating support, said shaft extending in a plane parallel to the plane of the stationary inductance plate and adjacent the ends of the arms of the U, a second inductance plate of generally U-shape, said second plate being mounted on said shaft at points adjacent the ends of the arms of the U, said first and second plates extending longitudinally of said shaft in substantial alignment with each other, a planar capacitor plate of generally arcuate from formed integrally with said stationary inductance plate at one end thereof and extending perpendicularly to the plane of said inductance plate and about said shaft, a capacitor plate formed integrally with said rotatable inductor plate at the corresponding end thereof, said last mentioned plate being slightly spaced longitudinally from said corresponding stationary capacitor plate forming with said stationary capacitor plate a variable capacitor, and a sliding contact at each end of said rotatable inductance plate, the one of said sliding contacts adjacent said rotatable capacitor plate being connected directly to an external circuit and the other of said sliding contacts being connected to the end of said stationary inductance plate remote from said stationary capacitance plate and to an external circuit whereby a variable resonant circuit is formed.

References Cited in the file of this patent

UNITED STATES PATENTS

| | | |
|---|---|---|
| 2,490,836 | Schriefer | Dec. 13, 1949 |
| 2,540,137 | Page | Feb. 6, 1951 |
| 2,542,416 | Kach et al. | Feb. 16, 1951 |

UNITED STATES PATENT OFFICE
CERTIFICATE OF CORRECTION

February 17, 1959

Patent No. 2,874,294

Howard J. Tyzzer

It is hereby certified that error appears in the printed specification of the above numbered patent requiring correction and that the said Letters Patent should read as corrected below.

Column 6, line 41, for "from" read -- form --; line 46, for "mentioned plate" read -- mentioned capacitor plate --.

Signed and sealed this 23rd day of June 1959.

(SEAL)
Attest:

KARL H. AXLINE
Attesting Officer

ROBERT C. WATSON
Commissioner of Patents